United States Patent [19]

Pogge

[11] 4,104,090
[45] Aug. 1, 1978

[54] TOTAL DIELECTRIC ISOLATION UTILIZING A COMBINATION OF REACTIVE ION ETCHING, ANODIC ETCHING, AND THERMAL OXIDATION

[75] Inventor: Hans Bernhard Pogge, Hopewell Junction, N.Y.

[73] Assignee: International Business Machines Corporation, Armonk, N.Y.

[21] Appl. No.: 771,593

[22] Filed: Feb. 24, 1977

[51] Int. Cl.² .................. H01L 21/76; H01L 27/04
[52] U.S. Cl. ........................... 148/175; 29/577 R; 29/578; 29/580; 29/576 W; 148/187; 156/643; 156/648; 156/654; 156/657; 204/15; 204/32 S; 204/129.3; 204/129.65; 357/40; 357/49; 357/50
[58] Field of Search ............... 148/175, 187; 204/15, 204/325, 129.3, 129.65; 156/643, 648, 654, 657; 29/577, 578, 580, 576 W; 357/40, 49, 50

[56] References Cited

U.S. PATENT DOCUMENTS

| | | | |
|---|---|---|---|
| 3,575,740 | 4/1971 | Castrucci et al. | 148/175 |
| 3,640,806 | 2/1972 | Watanabe et al. | 204/32 S |
| 3,919,060 | 11/1975 | Pogge et al. | 204/129.3 |
| 3,954,523 | 5/1976 | Magdo et al. | 148/175 |
| 3,966,577 | 6/1976 | Hochberg | 357/50 X |
| 3,972,754 | 8/1976 | Riseman | 148/175 |
| 3,997,378 | 12/1976 | Kaji et al. | 148/174 |

FOREIGN PATENT DOCUMENTS 102,988  12/1973  Japan ......................................... 148/175

OTHER PUBLICATIONS

Badami et al., "Dielectric Isolation of Silicon Devices," I.B.M. Tech. Discl. Bull., vol. 18, No. 1, Jun. 1975, pp. 116–117.

*Primary Examiner*—L. Dewayne Rutledge
*Assistant Examiner*—W. G. Saba
*Attorney, Agent, or Firm*—George O. Saile

[57] ABSTRACT

A process which utilizes an anodized porous silicon technique to form dielectric isolation on one side of a semiconductor device is described. Regions of silicon semiconductor are fully isolated from one another by this technique. The starting wafer typically is predominantly P with a P+ layer thereon. A P or N layer over the P+ layer is formed thereover such as by epitaxial growth. The surface of the silicon is oxidized and a photoresist layer applied thereto. Openings are formed in the photoresist. Openings are formed in the silicon dioxide using the photoresist as a mask and appropriate etching techniques. The openings in the silicon dioxide define the regions to be etched by reactive ion etching. Reactive ion etching is accomplished at least down to the P+ region. The structure is then subjected to the anodic etching technique which preferentially attacks the P+ layer to form porous silicon throughout the P+ layer. The structure is then placed in a thermal oxidation ambient until the porous silicon layer has been fully oxidized to silicon dioxide. The openings through the surface layer are filled up with oxide to fully isolate the P or N surface layer.

12 Claims, 9 Drawing Figures

1

TOTAL DIELECTRIC ISOLATION UTILIZING A COMBINATION OF REACTIVE ION ETCHING, ANODIC ETCHING, AND THERMAL OXIDATION

BACKGROUND OF THE INVENTION

The invention relates to methods for fully dielectrically isolating regions of monocrystalline silicon from other regions of monocrystalline silicon using a complete frontside process.

DESCRIPTION OF PRIOR ART

In the monolithic integrated circuit technology, it is usually necessary to isolate various active and passive elements from one another in the integrated circuit structure. These devices have been isolated by backbiasing PN junctions, partial dielectric isolation and complete dielectric isolation. The dielectric materials used have been silicon dioxide, glass and so forth. The preferred isolation for these active devices and circuits is the complete dielectric isolation. However, such structures are very difficult to fabricate by the present techniques.

One form of complete dielectric isolation is taught in J. G. Kren et al U.S. Pat. No. 3,419,956 and the P. P. Castrucci et al U.S. Pat. No. 3,575,740, both of which are assigned to the present assignee. The method of manufacturing this form of dielectric isolation involves the formation of a grid of channels in a monocrystalline silicon semiconductor wafer. A layer of silicon dioxide or other dielectric material is then formed on the surface of the wafer. Polycrystalline silicon is then grown on top of the silicon dioxide or other dielectric material in a substantial thickness. The monocrystalline silicon is then etched or lapped away until the grid of channels which are silicon dioxide or other dielectric material is reached. The remaining portions of the monocrystalline silicon wafer are now isolated from one another from the grid of dielectric material. Semiconductor elements and circuits can now be formed in the isolated monocrystalline silicon regions.

The porous anodized silicon and subsequent oxidation thereof method has been used to form fully isolated pockets of monocrystalline silicon in the Y. Watanabe et al U.S. Pat. No. 3,640,806 and the H. B. Pogge et al U.S. Pat. No. 3,919,060, the latter being assigned to the assignee of the present invention.

The Watanabe et al patent describes in its FIG. 4 embodiment the method for complete isolation of monocrystalline pockets wherein a silicon nitride film is formed on a P type silicon substrate, and the silicon nitride film is then partially removed by means of photoetching. The remaining silicon nitride film is shown by reference number 2. The exposed surface area of the silicon substrate 1 is processed to form porous film 5. Silicon nitride film 2 is removed. A P+ type silicon monocrystalline silicon layer 6 is epitaxially grown on the substrate. A silicon nitride film is formed on the bottom of the monocrystalline silicon 1 and conventional masking photolithography techniques are used to form porous silicon regions 5'. The regions are then oxidized to form an insulator completely around monocrystalline regions 1 as shown in FIG. 4E. The process has numerous disadvantages particularly involving its length and complexity.

The Pogge et al patent describes a method for forming fully dielectrically isolated regions wherein there is formed in a silicon substrate high conductivity regions or regions of an opposite conductivity to the substrate that define the ultimate desired dielectric regions. These regions are anodically etched using hydrofluoric acid solution to selectively produce regions of porous silicon structure in the high conductivity or opposite conductivity type regions. These porous silicon regions are then exposed to oxidizing environment while heated to an elevated temperature to oxidize porous silicon regions to form the complete dielectric isolation of monocrystalline silicon regions.

While the Watanabe et al and Pogge et al patents do give full dielectric isolation, there are problems involving gradients of P+ in the vertical direction which will produce nonuniformity of silicon dioxide and resultant stresses in the body. Further, there is difficulties in abutting PN junctions against this type of isolation and the depth of isolation is limited to the depth of the P+ diffusion.

SUMMARY OF THE PRESENT INVENTION

In accordance with the present invention, a method for forming total dielectric isolation is described wherein only frontside wafer processing is required to achieve isolation and almost perfect vertical wall isolation with good thermal silicon dioxide is achieved. The vertical wall dielectric isolation allows optimum high density device integrated circuits while the isolation can extend very deeply into the body. The technique also allows an almost perfectly planar resulting structure.

The method for forming the total dielectric structure begins by providing a silicon body having a high conductivity P layer over one side. An epitaxial deposited growth of monocrystalline silicon surface layer of another conductivity such as N or P less doped than the P+ is formed over the high conductivity P region. A matrix of openings or channels are formed through the surface layer in the regions where the dielectric isolation is desired. The minimum distances between the channels in the surface layer which surround monocrystalline silicon regions must be kept sufficiently narrow so that subsequent anodization and oxidation of the P+ region may be completed. The body is placed in a silicon anodization bath which produces porous silicon preferentially in the P+ regions. The body is removed from the anodization bath and subjected to thermal oxidation wherein the porous silicon is oxidized together with at least a portion of the openings channels and the surface of the surface layer. Thermal oxidation may be continued until the channel is completely oxidized or ended and a chemical vapor deposition of silicon dioxide or other suitable material deposited over the surface of the surface layer and filling the openings or channels. The silicon dioxide region which fills the P+ regions does not cause undue stressing because the structure allows the upward movement or collapse of the islands of monocrystalline silicon, the specific movement depending on the original porosity used in the P+ region.

DESCRIPTION OF THE PREFERRED EMBODIMENTS

Referring now more particularly to FIGS. 1-4, the preliminary steps of manufacturing the full dielectrically isolated silicon regions are shown. The structure of FIG. 1 which includes the monocrystalline silicon substrate 10 which is shown as P— for illustration purposes, a P+ layer 12 over the substrate 10 and an N— layer 14 on the layer 12. The N— layer could alternately be a P conductivity layer. This structure could be fabricated by various techniques. However, the preferred technique is to provide a P— monocrystalline silicon substrate and diffuse a P+ blanket diffusion into the substrate 10 using conventional thermal diffusion or ion implantation of boron to produce a region and a surface concentration of between about $1 \times 10^{19}$ to $1 \times 10^{20}$ atoms/cc. The layer 14 is subsequently grown onto the 10, 12 structure by means of epitaxial growth. This may be done by conventional techniques such as the use of $SiCl_4/H_2$ or $SiH_4/H_2$ mixtures at growth temperatures of about 1000° C-1200° C. The P+ layer may have a typical thickness of about 1.0-2.0 microns whereas the epitaxial layer has a thickness of 1-10 microns, the exact thickness depending on the device to be built.

Alternatively, the structure could be made by various combinations of thermal diffusion, ion implantation and/or epitaxial growth methods which would include the formation of a buried subcollector region for subsequent formation bipolar devices.

Figure 1:
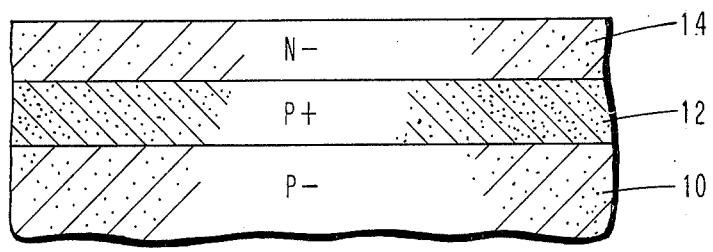
FIGS. 1–4 are cross-sectional drawings illustrating the preliminary steps to the formation of total dielectric isolation of the present invention.
Figure 2:
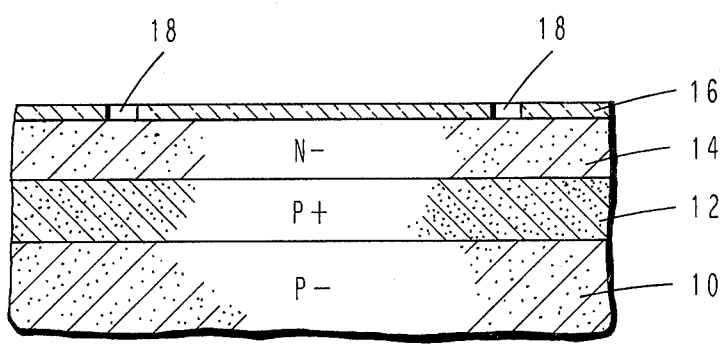
Figure 3:
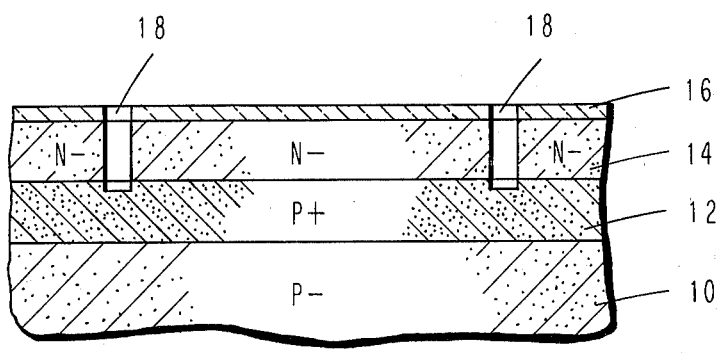

The next series of steps shown in FIGS. 2 and 3 are directed to the technique for reactive ion etching of substantially vertical openings or channels in the surface layer 14. The details of this reactive ion etching of silicon may be understood most fully by reference to the J. M. Harvilchuck et al patent application Ser. No. 594,418, filed July 9, 1975, now abandoned entitled "Reactive Ion Etching of Silicon" and assigned to the assignee of the present invention. Briefly, the process involves the growth of a mask material 16 on the surface of the surface layer 14. This material 16 must have the physical and chemical characteristics which involve substantial inertness to the etching plasma for etching silicon. The preferred materials for the mask layer 16 are silicon dioxide, silicon nitride or aluminum oxide wherein the RF induced plasma is reactive chlorine, bromine or iodine species as specified in the Harvilchuck et al patent application. After the blanket deposition of the mask material 16 on the layer 14, conventional photolithography techniques are utilized to form openings 18, in the layer wherein the silicon is desired to be etched. The thickness of the masking layer is between about 10,000 to 20,000 Angstroms. The precise description of the RF glow discharge apparatus is given in the beforementioned patent application. The reactive ion etch or plasma ambient is preferably a combination of an inert gas such as argon and a chlorine specie. Application of suitable power in the order of about 20 to 200 watts from a RF voltage source will produce sufficient power density to cause the reactive ion etching operation to be carried out in less than an hour. The desired result of the etching is in FIG. 3 wherein the openings or channels at least partially penetrated the high conductivity P region. The channels or openings may go substantially through the P+ layer 12 or even all the way through the layer to the substrate 10. These latter alternatives produce greater surface area for subsequent P+ silicon anodization and oxidizing of porous silicon.

Figure 4:
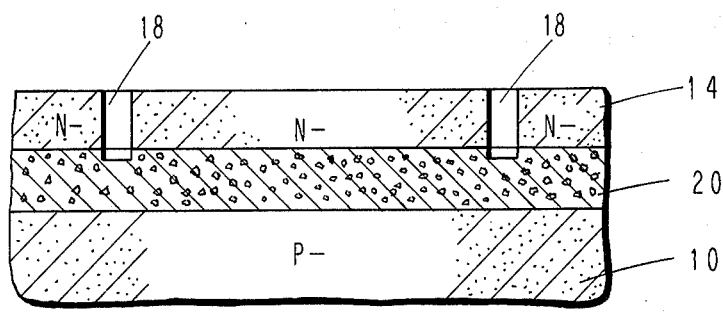

The high P conductivity region 12 is anodized by placing the body in a solution which converts the silicon in the region 12 to a porous silicon structure as shown in FIG. 4. This can be conveniently accomplished by anodizing the structure in an aqueous HF solution at a current density sufficient to achieve a relatively high porosity. The anodizing solution contains an amount greater than 10% HF and preferably in the range of 12 to 25% HF.

The substrate 10 is made the anode in an HF solution and a suitable metal plate is placed in the anodizing solution to act as cathode. After the anodization step is complete, the average porosity of the porous silicon should be greater than about 40% and more preferably in the range of 50-80%. The porosity is important so that sufficient oxidation can occur to produce a dense dielectric layer in the succeeding step without introducing significant internal stresses. The exact porosity of the silicon can be adjusted by varying the HF concentration of the anodizing solution, the temperature of the solution, the dopant concentration of the silicon region being anodized and the current density. The current density utilized is within the range of 20 to 60 milliamperes/cm$^2$. The resulting porous silicon layer 20 is shown in FIG. 4.

Figure 5:
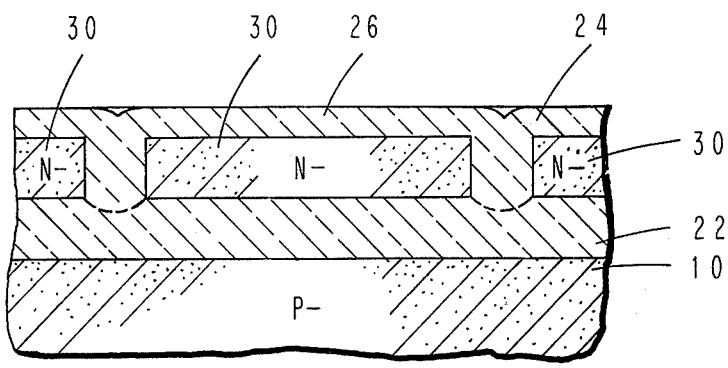
FIG. 5 illustrates the completed dielectric isolation step for one form of the present invention.

FIG. 5 illustrates the resulting oxidized structure wherein thermal oxidation is continued for sufficient time to fully form thermally grown silicon dioxide 22 in the formerly porous silicon region 20, in the opening or channel region 24 and on the surface 26. The ambient of approximately 950°-1000° C for about 17 hrs. will close about a 2 microns opening. The oxidizing ambient is steam. The resulting dielectrically isolated regions 30 are isolated from one another by silicon dioxide. The problem with this embodiment is the length of time required to thermally oxize and fill the opening or channel regions 24 with silicon dioxide.

Figure 6:
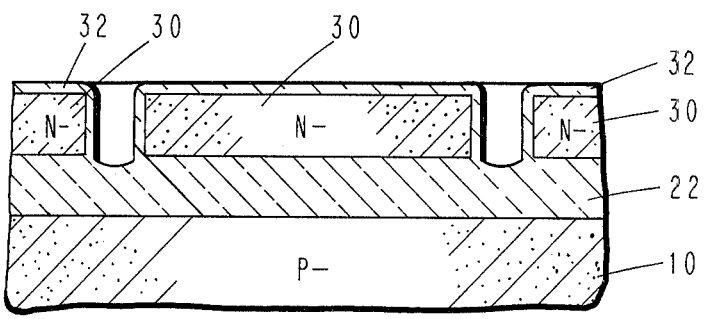
FIGS. 6 and 7 illustrate the steps for completing a second form of total dielectric isolation.
Figure 7:
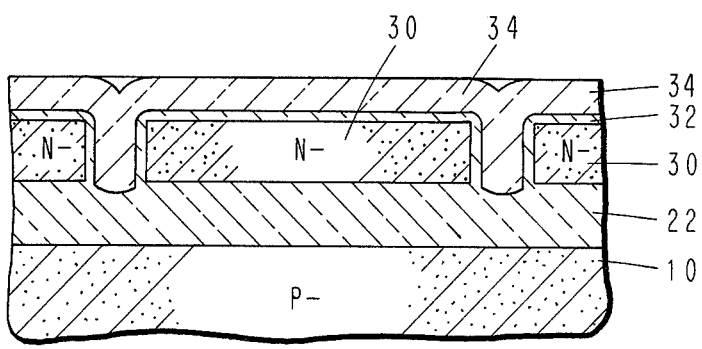

A second oxidizing embodiment is shown in FIGS. 6 and 7. In this embodiment the body is placed in a similar oxidizing ambient at 950°-1000° C but for a lesser amount of time which is of the order of 20 min. In this embodiment the porous silicon region 20 is oxidized to form silicon dioxide region 22 and a thin thermal silicon dioxide coating 32 over all exposed silicon regions which include the opening or channel regions and the monocrystalline silicon surface layers as shown in FIG. 6. The structure is now placed in a chemical vapor deposition apparatus wherein a dielectric material 34 such as silicon dioxide, silicon nitride, aluminum oxide or combinations thereof, or even polycrystalline silicon, is deposited over the upper surface of the body of the structure. This process is typically a chemical vapor deposition of a gas mixture of $N_2O$, $SiH_4$ and $N_2$ at growth temperatures of about 800° C for forming $SiO_2$. The resulting coating 32 34 completely covers the silicon monocrystalline isolation region 30 and the channels and openings in between these regions. The A. K. Hochberg U.S. Pat. No. 3,966,577 gives more information concerning the oxidation and filling by chemical vapor deposition procedures, vertical openings or channels in the silicon.

Figure 8:
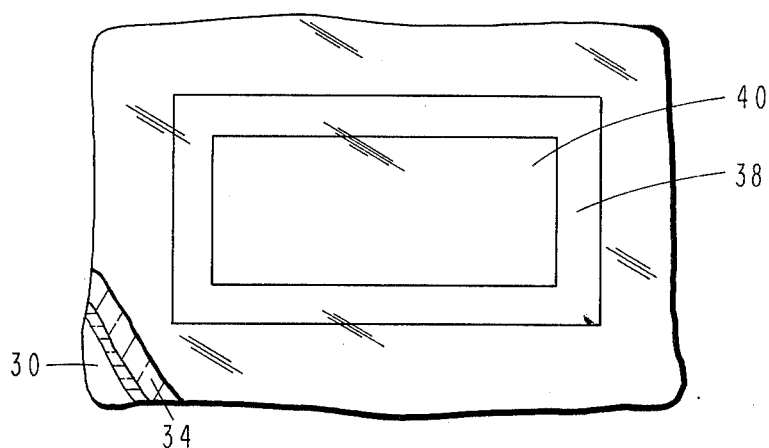
FIG. 8 shows a planar view of the opening or channel surrounding a monocrystalline silicon region.
Figure 9:
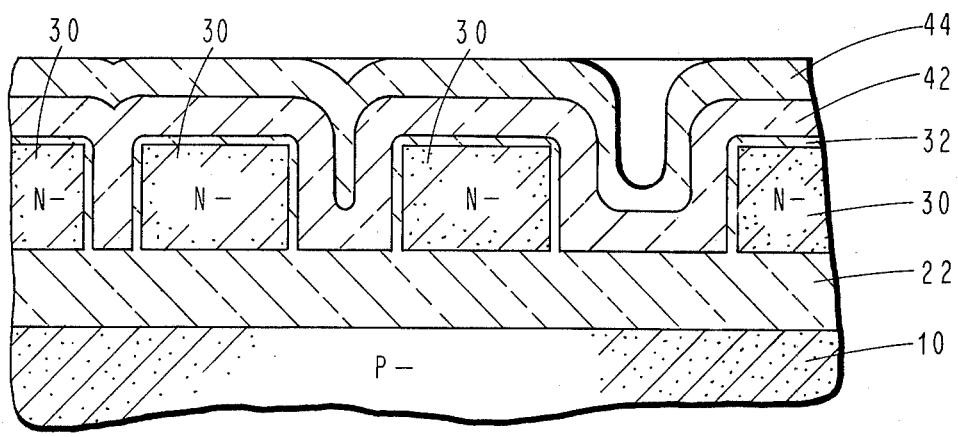
FIG. 9 shows a cross-sectional view illustrating the problems involved in filling the channel or openings with a silicon dioxide or other dielectric material.

One critical problem has to be overcome involving the formation of a complete silicon dioxide region 22 to fully dielectrically isolate the monocrystalline regions 30. The channel or openings have to be sufficient in size to allow the reactive materials to efficiently pass within them and react first to form the porous silicon region 20 from the concentration P region 12 and secondly to form the silicon dioxide region 22 from the porous silicon region 20. Because of this the opening should be a minimum width of about 0.3 microns which is based upon capability of lithography. Another critical factor is the minimum distance or width between openings in the surface layer for each surrounding region being less than about 300 microns so that particularly the oxidizing process can progress through the entire porous layer. This is illustrated in FIG. 8 wherein the opening 38 surrounds a monocrystalline silicon isolated rectangular region 40. The other dimension of rectangle can be very extensive and is not critical.

Where the width of the opening or channel is unduly wide, the problem of filling the opening with dielectric material becomes an even greater problem. In the filling technique of complete thermal oxidation, the time required for this filling becomes substantial when the width of the opening is greater than about 2 microns. FIG. 9 illustrates the problem involving filling the openings or channels of different widths by the thermal oxidation and chemical vapor deposition oxidizing embodiment. The three widths in FIG. 9 shown are 1 1 micron, 2 microns and 3 microns. Like numbers in the FIGS. 7 and 9 indicate like regions. With the deposition of 1 micron of chemical deposition silicon dioxide 42, the narrowest opening is filled. However, the other two openings are not filled. With the addition of a second 1 micron layer of chemical deposition silicon dioxide 44, the middle-sized opening is filled. However the large opening is not. Therefore there must be a balance between the problem of having a large enough opening to allow the reactive materials for anodizing silicon and oxidizing the porous silicon to reach the varied regions versus the problem of unduly large openings using up real estate from subsequent to be formed devices and the requirement for very thick chemical vapor deposition or thermal oxide formation on the surface to fill the openings. The width of the opening should be preferably less than 3 microns.

While the invention has been particularly shown and described with reference to the embodiments thereof, it will be understood by those skilled in the art that the foregoing and other changes in form and detail may be made without departing from the spirit and scope of the invention.

What is claimed is:

1. A method for forming total dielectric isolation in a silicon structure comprising:
    providing a silicon body composed principally of one conductivity, a layer of P+ conductivity thereover and a surface layer of a conductivity other than that of said layer; said body and said surface layer being less highly doped than said P+ layer;
    forming openings in said surface layer by reactive ion etching down to the said P+ layer;
    anodically etching the body in a hydrofluoric acid solution to selectively convert the said P+ conductivity silicon layer to a layer of porous silicon; and
    oxidizing the resultant porous silicon layer to form a silicon oxide layer and oxidizing the silicon in the said surface layer within the said openings and on its surface to form fully isolated regions of said surface layer.

2. The method of claim 1 wherein said reactive ion etch is accomplished using a chlorine specie.

3. The method of claim 1 wherein the silicon porosity of said P+ layer is between about 40 to 80 after said anodically etching the body.

4. The method of claim 1 wherein the width of said opening is between about 0.3 to 3.0 microns.

5. The method of claim 1 wherein the said reactive ion etching additionally passes through the said P+ layer.

6. The method of claim 1 wherein said surface layer and resulting fully isolated regions of said surface layer are P type.

7. The method of claim 1 wherein said surface layer and resulting fully isolated regions of said surface layer are N type.

8. The method of claim 1 wherein the thickness of said P+ layer is between about 1 to 2 microns.

9. The method of claim 1 wherein the minimum distance between said openings in said surface layer for each surrounded region is less than about 300 microns so that said oxidizing can progress through the entire said porous silicon layer under said surrounded region.

10. The method of claim 1 wherein a portion of said oxidizing is thermal and the remaining is by chemical vapor deposition.

11. The method of claim 10 wherein said thermal oxidizing occurs between 950° to 1000° C for between 1 to 20 hours in a steam ambient.

12. The method of claim 10 wherein the said chemical vapor deposition of silicon dioxide occurs at 800° C in a $N_2O/SiH_4/N_2$ gas mixture.

* * * * *